(12) United States Patent
Purcell et al.

(10) Patent No.: US 6,206,964 B1
(45) Date of Patent: Mar. 27, 2001

(54) MULTIPLE HEAD DISPENSING SYSTEM AND METHOD

(75) Inventors: Thomas Purcell, Haverhill; Thomas C. Prentice, Westford, both of MA (US); Brian P. Prescott, Fremont, NH (US)

(73) Assignee: Speedline Technologies, Inc., Franklin, MA (US)

( * ) Notice: Subject to any disclaimer, the term of this patent is extended or adjusted under 35 U.S.C. 154(b) by 0 days.

(21) Appl. No.: 09/189,014

(22) Filed: Nov. 9, 1998

Related U.S. Application Data

(60) Provisional application No. 60/065,061, filed on Nov. 10, 1997.

(51) Int. Cl.[7] .................................................. B05C 11/00
(52) U.S. Cl. .......................... 118/314; 118/313; 222/129
(58) Field of Search .................................. 118/313, 314, 118/315, 324; 222/129, 132, 144.5

(56) References Cited

U.S. PATENT DOCUMENTS

| | | | |
|---|---|---|---|
| 4,176,455 | 12/1979 | Copeland et al. | 33/1 |
| 4,835,710 | 5/1989 | Schnelle et al. | 364/513 |
| 4,838,515 | 6/1989 | Prentice | 248/661 |
| 4,979,093 | 12/1990 | Laine et al. | 364/167.01 |
| 5,092,021 | 3/1992 | Buzzi | 29/38 |
| 5,097,577 | 3/1992 | Buzzi et al. | 29/38 |
| 5,213,559 | 5/1993 | Lunazzi | 483/14 |
| 5,378,282 | 1/1995 | Pollard | 118/697 |
| 5,486,151 | 1/1996 | Bergmann et al. | 483/1 |
| 5,795,390 | * 8/1998 | Cavalloro | 118/314 |
| 5,807,044 | 9/1998 | Watari et al. | 409/183 |
| 5,957,343 | * 9/1999 | Cavallaro | 222/504 |
| 5,985,029 | * 11/1999 | Purcell | 118/324 |
| 6,007,631 | * 12/1999 | Prentice et al. | 118/669 |
| 6,093,251 | * 7/2000 | Carr et al. | 118/712 |

FOREIGN PATENT DOCUMENTS

| | | |
|---|---|---|
| 667 631 A5 | 10/1988 | (CH) . |
| 42 34 675 | 4/1993 | (DE) . |
| 0 278 457 | 8/1988 | (EP) . |
| 0 508 130 | 10/1992 | (EP) . |
| 0 700 733 | 3/1996 | (EP) . |
| 2 621 715 | 4/1989 | (FR) . |
| 2 398 937 | 2/1997 | (FR) . |
| 2 292 598 | 2/1996 | (GB) . |

OTHER PUBLICATIONS

Ing, et al. "The Hexapod Principle" Laboratory for Machine Tools and Production Engineering at Aachen University of Technology.

Hexel Corporation brochure "Hexel's Hexapod Solutions".

Cooke, Arthur, et al. Advanced reconfigurable machine for flexible fabrication. *1995 North AmericanConference on Smart Structures and Materials,* San Diego, CA, Feb. 26–Mar. 3, 1996.

Patent Abstracts of Japan vol. 97, No. 3, Mar. 31, 1997 & JP 08 298394 A (Tescon KK), Nov. 12, 1996.

Patent Abstracts of Japan, vol. 17, No. 434 (E–1412), Aug. 11, 1993 & JP 05 090799 A (TDK Corp), Apr. 9, 1993.

International Search Report dated Apr. 19, 1999.

* cited by examiner

*Primary Examiner*—James Sells
(74) *Attorney, Agent, or Firm*—Mintz, Levin, Cohn, Ferris, Glovsky and Popeo, P.C.

(57) ABSTRACT

A multiple head dispensing system and method is provided. In one embodiment, a dispensing system for dispensing material onto a substrate includes a plurality of independently operable dispensing heads, and a conveyor system, disposed beneath the plurality of dispensing heads, having a first track and a second track, each of which is constructed and arranged to convey substrates to working positions beneath the dispensing heads. The dispensing system may include a plurality of gantry systems, each of which is coupled to one of the plurality of independently operable dispensing heads.

15 Claims, 4 Drawing Sheets

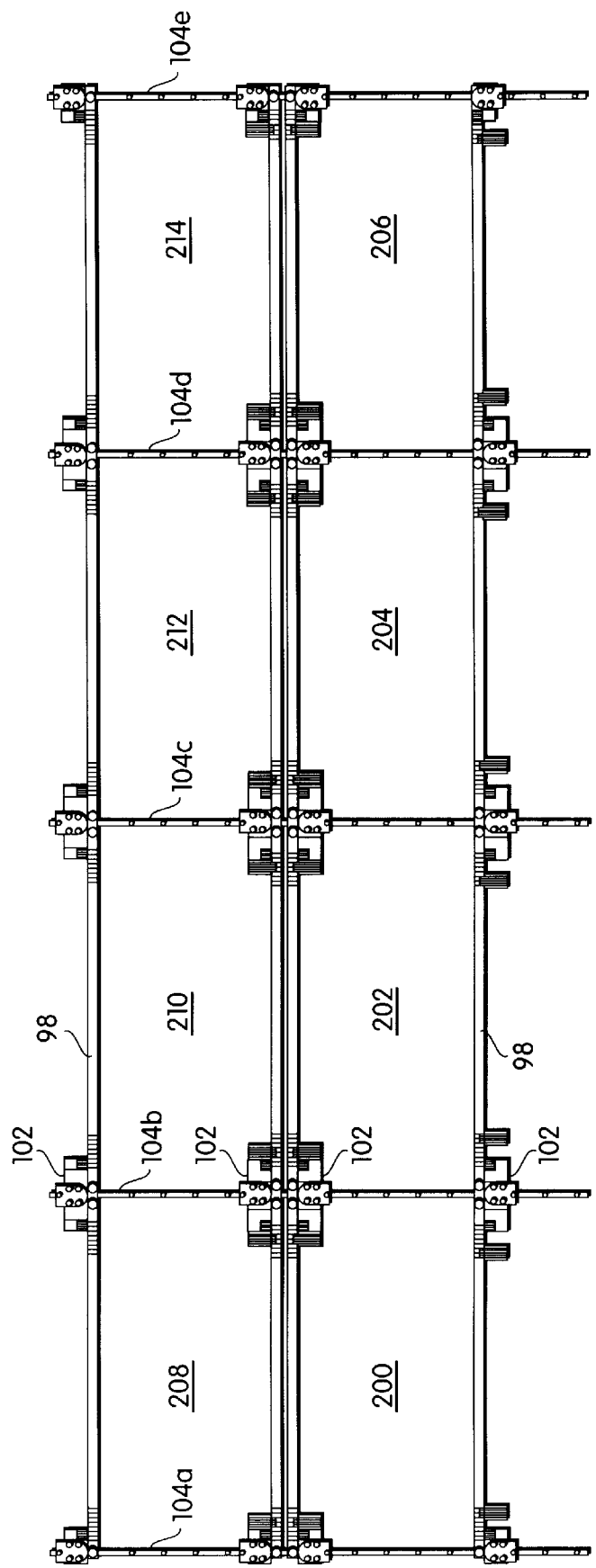

MULTIPLE HEAD DISPENSING SYSTEM AND METHOD

RELATED APPLICATIONS

This Application claims priority from U.S. Provisional Application Ser. No. 60/065,061, which is incorporated herein by reference.

FIELD OF THE INVENTION

The present invention relates generally to an apparatus and method for performing a plurality of work operations in parallel using a plurality of work devices within one workstation. More specifically, the present invention relates to an apparatus and method for dispensing material onto a substrate using a plurality of dispensing heads within a dispensing system.

BACKGROUND OF THE INVENTION

There are several types of prior art dispensing systems used for dispensing metered amounts of liquid or paste for a variety of applications. One such application is in the assembly of printed circuit boards and integrated circuit chips. In this application, dispensing systems are used in the process of encapsulating integrated circuits with an encapsulating material and in the process of underfilling flip integrated circuit chips with an encapsulent. Prior art dispensing systems are also used for dispensing dots or balls of liquid epoxy or solder onto circuit boards and integrated circuits. The liquid epoxy and solder is used to connect components to a circuit board or to an integrated circuit. The dispensing systems described above include those manufactured and distributed by Camelot Systems, Inc., the assignee of the present invention, under the name CAM/ALOT®.

The dispensing systems described above are typically used in an electronics manufacturing facility in an automated assembly line with other equipment used in a circuit board or integrated circuit manufacturing process. The other equipment in-line with the dispensing systems may include, for example, pick and place machines, which place components on circuit boards, or reflow ovens that are used to cure materials dispensed onto the circuit boards or integrated circuits.

In a typical dispensing system, a pump and dispenser assembly is mounted to a moving assembly for moving the pump and dispenser assembly along three mutually orthogonal axes (x, y, z) using servomotors controlled by a computer system or controller. To dispense a dot of liquid on a circuit board at a desired location, the pump and dispenser assembly is moved along the horizontal x and y axes until it is located over the desired location. The pump and dispenser assembly is then lowered along the vertical z axis until the nozzle of the pump and dispenser assembly is at an appropriate dispensing height over the board. The pump and dispenser assembly dispenses a dot of liquid, is then raised along the z axis, moved along the x and y axes to a new location, and is lowered along the z axis to dispense the next liquid dot.

During the manufacture of circuit boards, it is sometimes necessary, or desirable, to dispense two different liquids or pastes onto a circuit board or to dispense different volumes of the same material. Dispensing systems have been designed that can dispense one of a number of dispensing materials from one dispensing head. One example of such a dispensing system is described in U.S. patent application Ser. No. 08/519,146, filed Aug. 24, 1995, U.S. Pat. No. 5,795,390 which is incorporated herein by reference. However, these dispensing systems typically are only able to dispense one material at a time, and the throughput of product in these systems may be less than desired because of the time required to dispense multiple materials serially using one dispensing head.

To overcome the throughput problem, two dispensing systems may be placed adjacent to each other with the first dispensing system dispensing one material and the second dispensing system dispensing a second material. This solution is expensive since two complete machines are used, and since additional manufacturing space is required. In typical operations, manufacturing floor space is limited, and it is desirable to limit the "footprint" of each manufacturing system on the manufacturing floor.

In electronics assembly, it is not uncommon for some manufacturing systems to utilize multiple conveyor systems operating in parallel to increase product throughput of the systems. Typical prior art dispensing systems do not include multiple conveyor systems and are not fully compatible with other in-line systems using multiple conveyors. Therefore, it would be desirable to provide a dispensing system having multiple conveyors.

SUMMARY OF THE INVENTION

Embodiments of the present invention overcome drawbacks of the prior art discussed above by providing a multiple head dispensing system having independently controlled dispensing heads. Each of the dispensing heads may be independently controlled to provide simultaneous dispensing of different materials onto substrates.

In embodiments of the present invention, independent control of the dispensing heads is accomplished under the control of a controller in conjunction with a plurality of gantry systems, each of which positions one of the multiple dispensing heads over a substrate that is to receive dispensing material. In some embodiments, each gantry system utilizes two drive mechanisms, arranged in parallel, that provide movement of the dispensing head over an x-y plane.

In some embodiments of the present invention, multiple conveyor systems are utilized that allow parallel processing of work products in the dispensing systems.

Embodiments of the present invention are not limited to dispensing systems, but also include other systems utilizing multiple conveyors and multiple work devices coupled to a plurality of gantry systems to provide independent movement of each of the work devices.

BRIEF DESCRIPTION OF THE DRAWINGS

For a better understanding of the present invention, reference is made to the drawings which are incorporated herein by reference and in which:

FIG. 4 is a top view of the conveyor system shown in FIG. 3.

DETAILED DESCRIPTION

For purposes of illustration, embodiments of the present invention will now be described with reference primarily to a multiple head dispensing system, however, those skilled in the art will appreciate that embodiments of the present invention are not limited to dispensing systems, but include other systems in which a workpiece is used to perform some task on a product. Examples of such systems include test and measuring systems, component placement systems, inspection systems and machining systems, such as milling machines. In addition, embodiments of the present invention may include a number of different types of workpieces within one system. For example, a system may include a dispensing head, a vision inspection system, and a component placement head, each of which may be positioned independently using its own gantry system.

Figure 1:
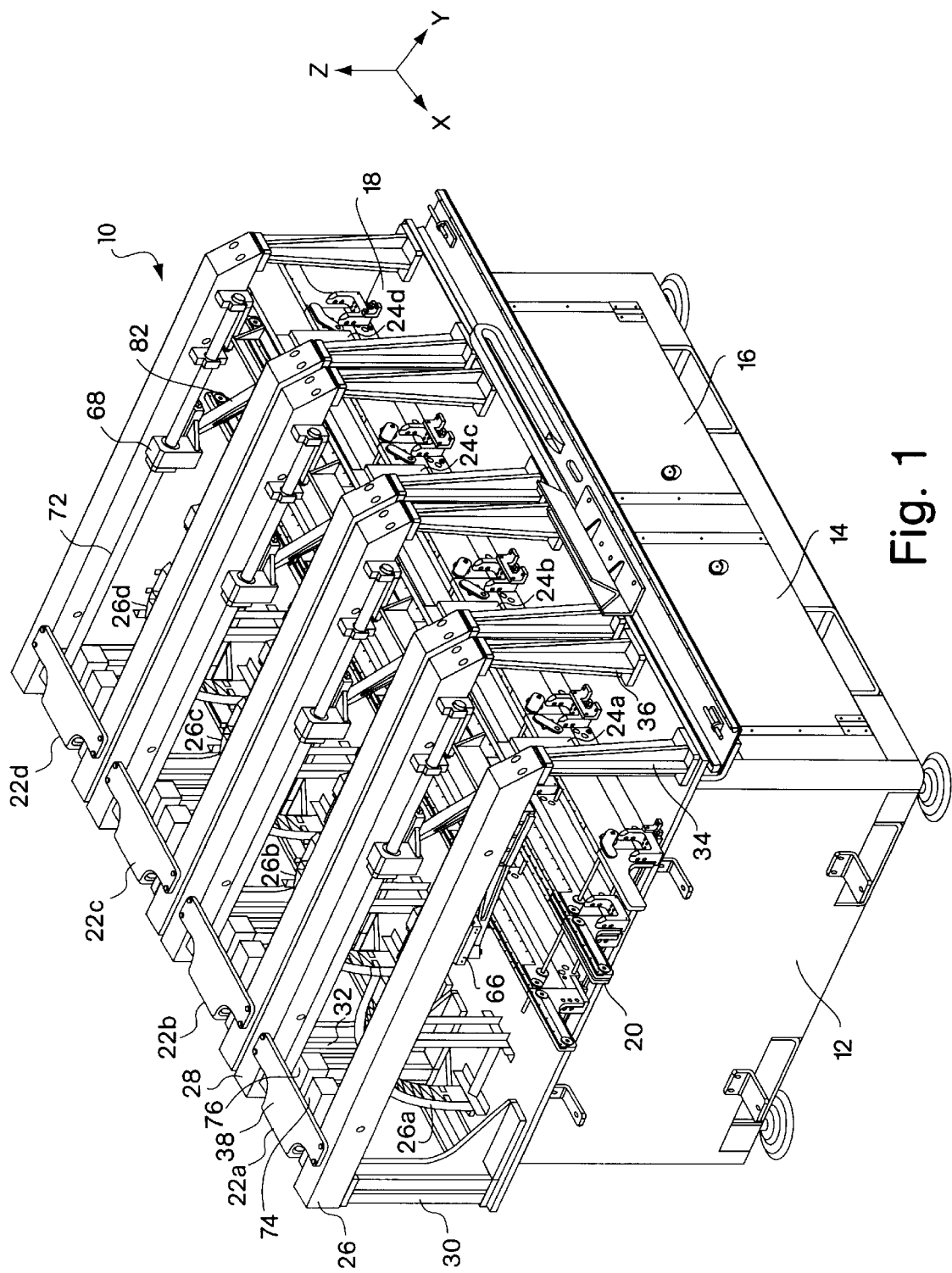
FIG. 1 is a perspective view of a multiple head dispensing system in accordance with one embodiment of the present invention.
Figure 2:
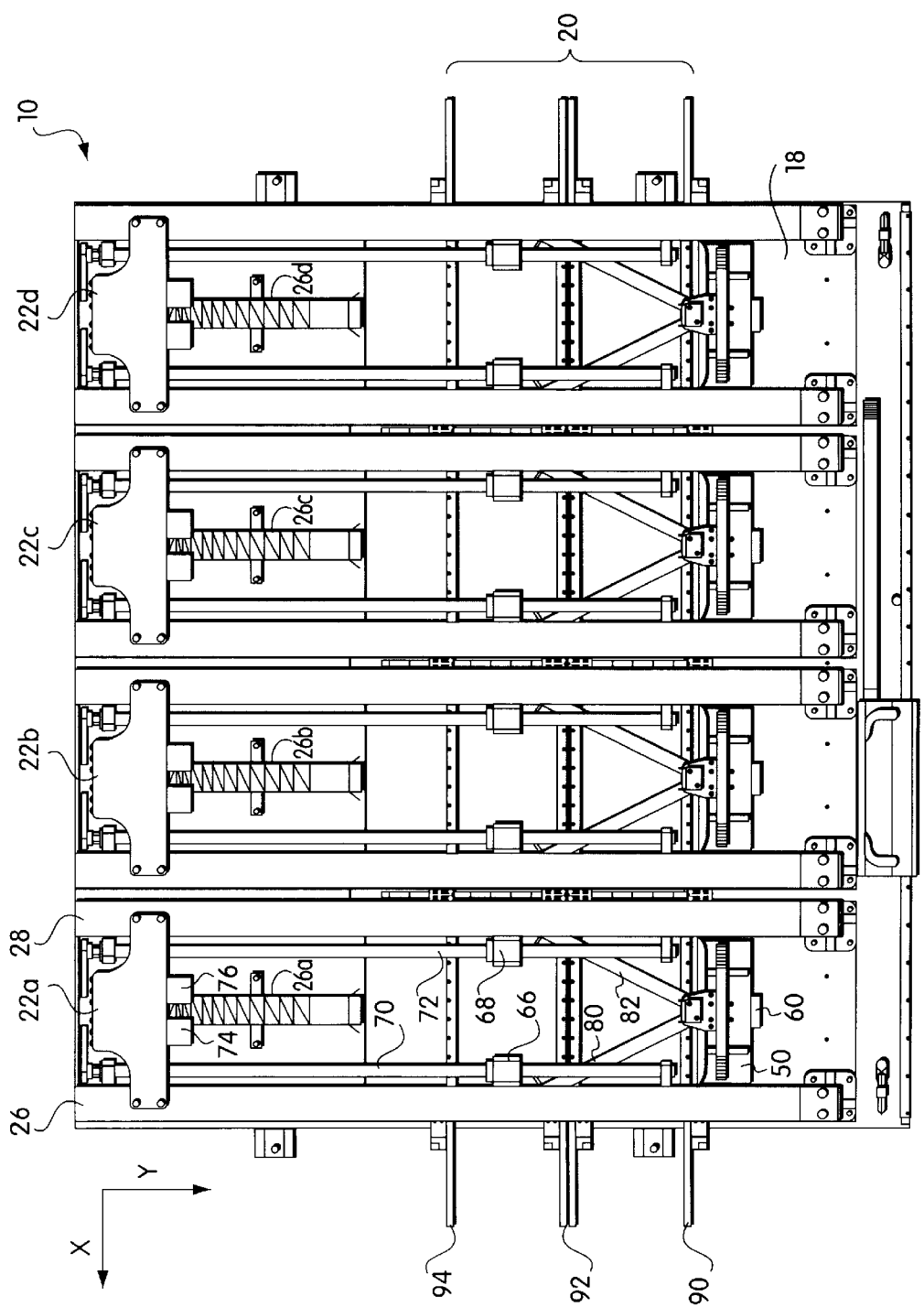
FIG. 2 is a top view of the dispensing system of FIG. 1.

One embodiment of a dispensing system 10 will now be described with reference to FIGS. 1 and 2. FIG. 1 shows a perspective view of a multiple head dispensing system 10 in accordance with one embodiment of the present invention. For ease of illustration, the system is shown in FIG. 1 without an outer covering. FIG. 2 shows a top view of the dispensing system 10.

The dispensing system 10 includes a lower compartment 12 that is used to house electrical and pneumatic controllers and a primary system controller. Access doors 14 and 16 are mounted on the front of the lower compartment to provide access to the equipment contained therein. The top of the lower compartment forms a work surface 18 on which a dual track conveyor 20 resides. Mounted to the work surface 18 are four x/y gantry systems 22a, 22b, 22c and 22d. Each of the gantry systems supports a dispensing head 24a, 24b, 24c and 24d which dispenses material onto substrates loaded into the dispensing system using the conveyor system 20. The work surface 18 has four holes through which four cable troughs 26a, 26b, 26c and 26d pass. Each of the cable troughs are used to run cables from the control electronics and pneumatics in the lower compartment to each of the dispensing heads 24a, 24b, 24c and 24d. In one embodiment, the cable troughs are implemented using an E-Chain available from Igus Corporation.

The gantry systems 22a, 22b, 22c and 22d are substantially identical and in one embodiment are implemented using one of the gantry systems disclosed in either U.S. patent application Ser. No. 08/967,682, U.S. Pat. No. 5,886,494 entitled "Positioning System", or in U.S. patent application Ser. No. 08/796,026, abandoned also entitled "Positioning System", filed February 6, 1997, both of which are incorporated herein by reference. Gantry system 22a will now be described in greater detail with reference to FIGS. 1 and 2, it being understood that gantry systems 22b, 22c and 22d are substantially identical to gantry system 22a. Gantry system 22a provides positioning of the dispensing head 24a along the horizontal, orthogonal x and y axes shown in FIG. 1. In addition, gantry system 22a includes a motor for lowering the dispensing head in the vertical z direction.

Gantry system 22a includes two horizontal support members 26 and 28 and four vertical support members 30, 32, 34 and 36 coupled to the work surface 18. A motor support plate 38 is coupled between the horizontal support members and is used to support two motors 74 and 76. The gantry 22a also includes a plate 50 that is slidably mounted to rails (not shown) disposed on the under side of each of the horizontal support members so that the plate can move along the y-axis. Dispensing head 24a is mounted to a carriage 60 which in turn is slidably mounted to the plate 50 to permit movement of the dispensing head along the x-axis.

Gantry system 22a further includes two nut blocks 66 and 68 that are slidably movable along the rails mounted under the horizontal support members 26 and 28. Each of the nut blocks is coupled to one of the motors 74, 76 through a respective lead screw 70, 72. The nut blocks can be separately driven by the motors using the lead screws to move the nut blocks along the y-axis. The carriage 60 is connected to each nut block 66, 68 with respective rigid trailing arms 80, 82 that are pivotally connected at one end to one of the nut blocks and at the other end to the carriage 60. As explained in greater detail in U.S. patent application Ser. No. 08/796,026, abandoned the dispensing head 24a may be positioned along the x and y axes by moving the nut blocks along the y-axis using motors 74 and 76.

The dispensing heads 22a, 22b, 22c and 22d may be implemented using a number of different dispensing heads including those disclosed in U.S. patent application Ser. No. 08/562,068, U.S. Pat. No. 5,819,983 and in U.S. patent application Ser. No. 08/885,005, U.S. Pat. No. 5,957,343 each of which is incorporated herein by reference.

Motors 74 and 76, as well as the z-axis motor coupled to the carriage 60, are controlled by the primary system controller located in the lower compartment. In one embodiment, the primary system controller is implemented using a personal computer with an Intel Pentium® processor running a version of the Microsoft Windows® NT operating system. In addition, in one embodiment, the primary system controller includes two Delta Tau PMAC2 motion control cards available from Delta Tau Data Systems, Inc., Northridge, Calif. Each of the motion control cards provides control signals to the motors 74 and 76 for two of the gantry systems 22a, 22b, 22c and 22d.

The gantry systems 22a, 22b, 22c and 22d provide a significant advantage in the dispensing system 10. As described in U.S. patent application Ser. No. 08/796,026, abandoned the ratio of the working area beneath the gantry system to the total width of the gantry system is much greater for the gantry systems described above than for typical x/y gantry systems. This reduces the time required to move a work product between work positions in the multiple head dispensing system, and also reduces the total footprint of the dispensing system 10.

Figure 3:
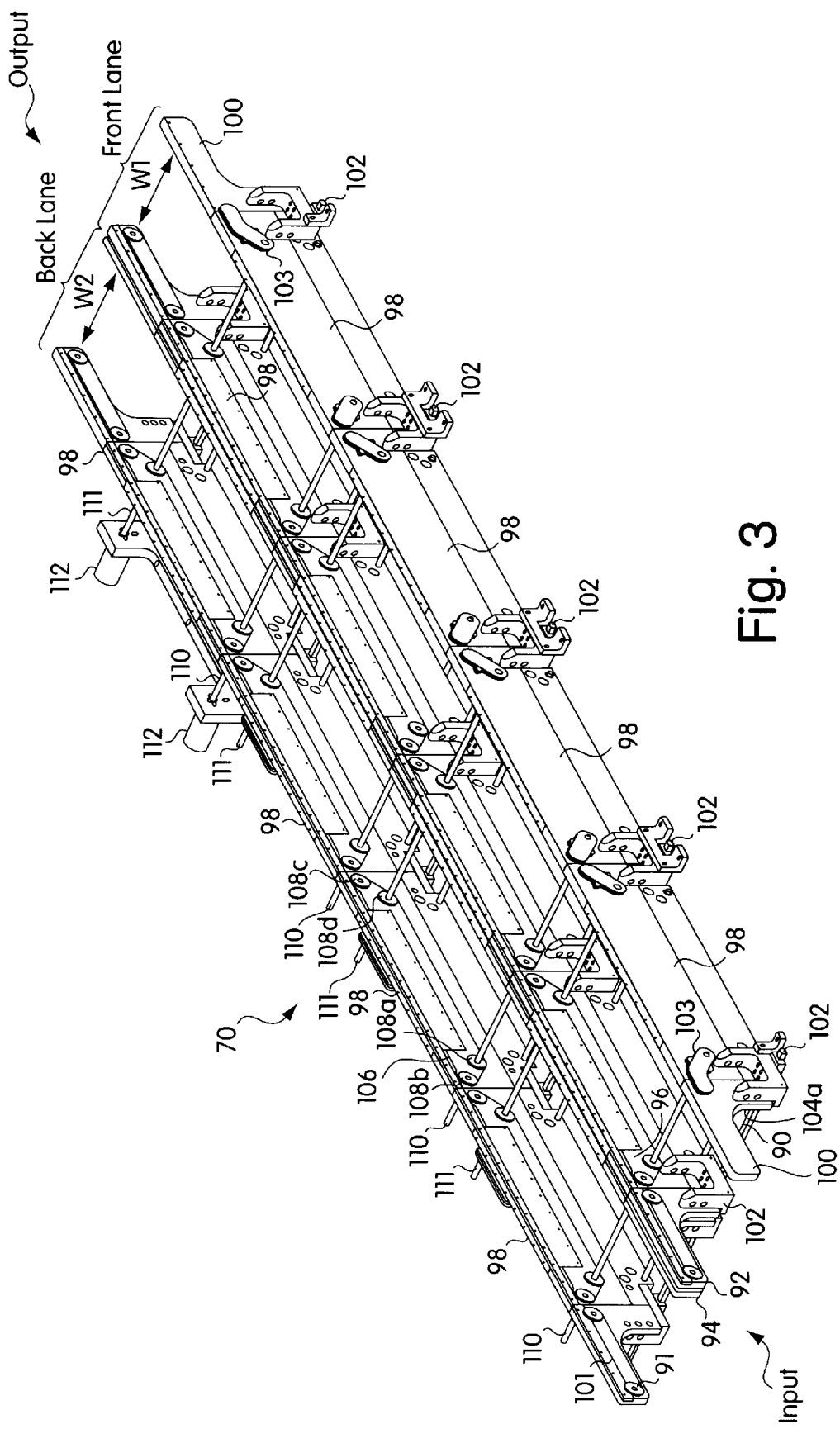
FIG. 3 is a perspective view of a conveyor system used in the dispensing system of FIG. 1.

The conveyor system 20 will now be described in greater detail with reference to FIGS. 3 and 4. FIG. 3 provides a perspective view of the conveyor system, while FIG. 4 provides a top view. Several elements of the conveyor system have been removed from the top view shown in FIG. 4 for clarity. The conveyor system 70 includes four rails 90, 92, 94 and 96 that define two lanes, identified as a back lane and a front lane, for transporting work products, such as circuit boards, integrated circuit carriers and other substrates into, through, and out of the dispensing system 10. The conveyor sections define eight work areas 200, 202, 204, 206, 208, 210, 212, and 214, as shown in FIG. 4.

Each of the rails comprises four substantially identical, modular conveyor sections 98, and each rail of the conveyor system has an end adapter 100 at each end of the rail. Support blocks 102 are used to hold rail sections 96 together and to hold the conveyor sections in place on the work surface of the dispensing system. The rails are connected by tracks 104a, 104b, 104c, 104d and 104e, which are mounted to the work surface.

The width w1 and w2 of each of the lanes of the conveyor system 20 may be adjusted by moving the rails to different positions along the tracks to accommodate different size work products. Width w1 may be different than width w2.

In one embodiment of the present invention, each of the modular conveyor sections 98 is implemented using a conveyor section in accordance with one of the embodiments disclosed in U.S. patent application Ser. No. 08/745,787, U.S. Pat. No. 5,985,029 filed Nov. 8, 1996, incorporated herein by reference. Specifically, the conveyor sections include a driver such as a pneumatic cylinder with a camming plate incorporated into the side of the conveyor section. The driver is used to lift work products above the conveyor to a work position beneath one of the dispensing heads of the dispensing system.

Each of the conveyor sections includes a conveyor 106 that may be implemented as a continuous belt consisting of black neoprene over a cotton cord or may be implemented as a series of links. The conveyor 106 is wrapped around four pulleys 108a, 108b, 108c and 108d. A total of eight drive shafts, four drive shafts 110 and four drive shafts 111, are used to operate the conveyors. Each of the drive shafts is coupled to its own motor 112 to allow independent operation of each pair of conveyor sections. Operation of each of the motors is controlled by the primary system controller. For simplification, only two of the motors 112 are shown in FIG. 3.

Four drive shafts 110 are used to drive the conveyor segments in the back lane, and four drive shafts 111 are used to drive the conveyor segments in the front lane. For uniformity and ease of manufacturing, all eight drive shafts are substantially identical, and each of the driveshafts extends through all four rails. Cogs are selectively added to the lower pulleys 108a and 108d to cause the pulleys to rotate with the drive shafts. In the conveyor system 20, for all conveyor sections in the back lane, the lower pulleys closest to the input side of the conveyor system include a cog, and the lower pulleys closest to the output side of the conveyor system do not have a cog. For all conveyor sections in the front lane, the lower pulleys closest to the input side of the conveyor system do not include a cog, and the lower pulleys closest to the output side of the conveyor system do include a cog. This implementation allows each pair of conveyor sections, defining one of the work areas, to operate independently. As understood by those skilled in the art, to meet specific application demands, the cogs may be arranged in other configurations.

Each of the end adapters 100 has a conveyor 101 that is coupled to the conveyor 106 of the adjacent conveyor section using an extension piece 103 so that each conveyor 101 is driven by the conveyor 106 of the adjacent conveyor section.

As described above, all of the conveyor sections 98 are substantially identical. In addition, each conveyor section is symmetrical about a vertical axis perpendicular to the direction of conveyor travel and passing through the middle of the conveyor section. This allows identical conveyor sections to be used on opposite rails of the same lane, and at any position (i.e., at the input end, output end, or in the middle) in any of the rails.

The conveyor system 20 includes several features that make it particularly desirable for use in the multiple head dispensing system 10. First, because the conveyor system is constructed using independently controllable, modular sections, the length of the conveyor system can be readily adjusted. Specifically, the number of segments used in each rail of each lane of the conveyor system may be adapted to correspond to the number of dispensing heads or other workpieces used in the dispensing system.

Second, the width of each rail segment in one embodiment of the present invention is only 0.56 inches thick. This is accomplished by incorporating a thin lifting plate within the side of each conveyor segment, as discussed above. Further, in some embodiments of the present invention, the conveyor belt is not used in clamping the work product in place at the proper work position. Rather, a clamp consisting of an independent blade which is easily removable and can be customized for a given application is used. In addition, an easily removable insert can be added to each segment to reduce the effective width of the conveyor to accommodate a variety of work products. The use of thin rail segments is desirable in embodiments of the present invention to reduce non-productive slew time as a dispensing head is moved from a completed work product in the first lane of the dispensing system to another work product in the second lane of the dispensing system.

The operation of the dispensing system 10 will now be described. While specific modes of operation are described herein, one of the significant advantages of embodiments of the present invention is the flexibility of the dispensing system to operate in a variety of modes, and embodiments of the present invention are not limited to the specific modes described herein. In one mode of operation, the dispensing system is configured for dispensing material on one type of circuit board in four separate operations, one operation being performed by each of the four dispensing heads. The front lane and the back lane are both configured to receive the same type of circuit board. In this configuration, when circuit boards are being indexed in one lane, dispensing can occur on the circuit boards in the other lane. This configuration increases the overall throughput of circuit boards compared to typical prior art dispensing systems, and reduces the amount of idle time of the dispensing heads due to indexing of circuit boards. This mode of operation employs a pipelined, parallel architecture to increase total system throughput.

In another mode of operation of the dispensing system 10, the system may be used to increase throughput even though a circuit board (or some other substrate) is to receive only one type of dispensing material, and the dispensing task requires only one size dispensing needle. For this mode of operation, each of the dispensing heads are substantially identical, and the overall dispensing task is divided and organized among the dispensing heads to provide the most efficient mode of operation. The division of the dispensing task among the dispensing heads may be accomplished in one of number of ways. The division may be made based on types of dots to be dispensed, based on dispensing locations on the circuit boards, or on other criteria.

In the embodiments discussed above, the number of conveyor sections in each rail is equal to the number of dispensing heads in the dispensing system. In other embodiments, the number of conveyor sections may be greater than the number of dispensing heads, and a gap may be provided between two of the gantry systems to provide a conveyor buffer segment. Such a buffer segment may be used as a preheat segment or for any other application that may require or benefit from a buffer segment.

In one embodiment of the present invention, the number of conveyor sections may be some multiple of the number of gantry systems. This provides additional flexibility in the operation of the system, and is useful when a work product, such as a circuit board, is larger than the work area of one of the gantry systems.

Embodiments of the present invention utilizing a dual lane conveyor system overcome drawbacks of prior art single lane dispensing systems by providing a system that is compatible with other dual lane manufacturing equipment in an automated assembly line. In addition, the multiple lane embodiments described herein may also be implemented into assembly lines with single lane equipment using a board shuttling mechanism between the multiple lane dispenser and other equipment. This is useful for relatively slow dispensing operations. Further, embodiments of the present invention provide for the dispensing of multiple materials within one dispensing system while maintaining high throughput rates.

Embodiments of the dispensing system described above include four gantry systems and a two lane conveyor system. As readily understood by one skilled in the art, dispensing systems (and other multiple workpiece machines) in accordance with embodiments of the present invention may include more or less than four gantry systems and a conveyor system having more or less than two lanes.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting.

What is claimed is:

1. A dispensing system for dispensing material onto a substrate, the dispensing system comprising:
   a plurality of independently operable dispensing heads; and
   a conveyor system, disposed beneath the plurality of dispensing heads, having a first track and a second track, each of which is constructed and arranged to convey substrates to working positions beneath the dispensing heads.

2. The dispensing system of claim 1, further comprising a plurality of gantry systems, each of the plurality of gantry systems being coupled to one of the plurality of independently operable dispensing heads.

3. The dispensing system of claim 2, wherein each of the gantry systems is constructed and arranged to provide movement of a corresponding one of the plurality of dispensing heads over a substrate in a working position on the first track and over a substrate in a working position on the second track.

4. The dispensing system of claim 3, wherein each of the first track and the second track includes a plurality of independently operable conveyor segments.

5. The dispensing system of claim 4, further comprising a vision inspection system coupled to a gantry system to allow positioning of the vision inspection system over substrates on the first track and over substrates on the second track.

6. The dispensing system of claim 5, wherein a number of independently operable conveyor segments in each of the first track and the second track is greater than a total number of dispensing heads in the dispensing system.

7. The dispensing system of claim 1, wherein each of the first track and the second track includes a plurality of independently operable conveyor segments.

8. The dispensing system of claim 1, wherein a number of independently operable conveyor segments in each of the first track and the second track is greater than a total number of dispensing heads in the dispensing system.

9. The dispensing system of claim 1, further comprising a vision inspection system coupled to a gantry system to allow positioning of the vision inspection system over substrates on the first track and over substrates on the second track.

10. A system for performing operations on a work piece, the system comprising:
    a plurality of independently operable work heads each of which performs an operation on a work piece;
    a conveyor system, disposed beneath the plurality of work heads, having a first track and a second track, each of which is constructed and arranged to convey work pieces to working positions beneath the work heads; and
    a plurality of gantry systems, each of the plurality of gantry systems being coupled to one of the plurality of independently operable work heads, and each of the gantry systems being constructed and arranged to provide movement of a corresponding one of the plurality of work heads over a work piece in a working position on the first track and over a work piece in a working position on the second track.

11. The system of claim 10, wherein each of the first track and the second track includes a plurality of independently operable conveyor segments.

12. The system of claim 10, wherein a number of independently operable conveyor segments in each of the first track and the second track is greater than a total number of work heads in the system.

13. A dispensing system for dispensing material onto a substrate, the dispensing system comprising:
    means for moving a first substrate to a first working position in the dispensing system;
    means for moving a second substrate to a second working position in the dispensing system; and
    means for dispensing material on the first substrate at the first working position and on the second substrate at the second working position.

14. The dispensing system of claim 13, further comprising:
    means for moving the first substrate to a third working position in the dispensing system; means for moving the second substrate to a fourth working position in the dispensing system; and
    means for dispensing material on the first substrate at the third working position and on the second substrate at the fourth working position.

15. The dispensing system of claim 14, further comprising:
    means for moving the first substrate to a first inspection position;
    means for moving the second substrate to a second inspection position; and
    means for inspecting the first substrate at the first inspection position and for inspecting the second substrate at the second inspection system.

* * * * *